(12) United States Patent
Lee

(10) Patent No.: US 8,154,949 B2
(45) Date of Patent: Apr. 10, 2012

(54) BURST TERMINATION CONTROL CIRCUIT AND SEMICONDUCTOR MEMORY DEVICE USING THE SAME CROSS-REFERENCES TO RELATED APPLICATION

(75) Inventor: Yin Jae Lee, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 378 days.

(21) Appl. No.: 12/455,616

(22) Filed: Jun. 4, 2009

(65) Prior Publication Data

US 2010/0146161 A1 Jun. 10, 2010

(30) Foreign Application Priority Data

Dec. 5, 2008 (KR) .......................... 10-2008-0123545

(51) Int. Cl.
*G11C 8/18* (2006.01)

(52) U.S. Cl. ............... 365/233.18; 365/189.05; 365/194

(58) Field of Classification Search ............. 365/233.18, 365/189.05, 194
See application file for complete search history.

(56) References Cited

U.S. PATENT DOCUMENTS

| 6,291,869 | B1 * | 9/2001 | Ooishi .......................... 257/500 |
| 7,030,596 | B1 | 4/2006 | Salemo et al. |

FOREIGN PATENT DOCUMENTS

JP  2000-011652  1/2000

* cited by examiner

*Primary Examiner* — Huan Hoang
(74) *Attorney, Agent, or Firm* — John P. White; Cooper & Dunham LLP

(57) ABSTRACT

A burst termination control circuit includes: a pull-up unit for pulling up a first node in response to a burst termination signal, a latch unit for latching a signal of the first node, a buffer for generating a first termination control signal for stopping data output operation by buffering an output signal of the latch unit, and a logic unit for generating a second termination control signal for stopping burst operation and generation of an output enable signal in response to an output signal of the latch unit.

17 Claims, 5 Drawing Sheets

BURST TERMINATION CONTROL CIRCUIT AND SEMICONDUCTOR MEMORY DEVICE USING THE SAME CROSS-REFERENCES TO RELATED APPLICATION

TECHNICAL FIELD

The present invention relates to a semiconductor memory, and more particularly, to a burst termination circuit.

BACKGROUND

Manufacturers of semiconductor memory devices, particularly dynamic random access memory (DRAM), continue to pursue higher speed operation and, as a result, synchronous DRAM has been introduced. The synchronous DRAM operates synchronously with a system clock provided from outside of the chip, and particularly, a typical operation of the synchronous DRAM is a burst operation in which when a burst length is set by a mode resist set (MRS) set upon enabling of the synchronous DRAM, data is continuously inputted or outputted by the set burst length by read command and write command.

The burst length set for the burst operation includes 4, 8, 16 and so on. An existing DDR2 SDRAM supports only burst lengths of 4 and 8, and a mobile DDR2 SDRAM supports burst lengths of 4, 8 and 16. Here, the burst length of 8 means that data of 8 bits is continuously inputted or outputted by the read command or the write command.

However, the conventional semiconductor memory device has a problem that, once the burst length is set by the MRS, the data is inputted or outputted by the set burst length regardless of actually inputted or outputted data length. That is to say, when the burst length is set to 8, the burst operation is terminated after the data of 8 bits is all inputted or outputted, even when actually inputted or outputted data is 4 bits. Therefore, unnecessary burst operation period is generated by the operation of inputting or outputting unnecessary data of 4 bits.

SUMMARY

In an aspect of this disclosure, there are provided a burst termination control circuit capable of enhancing an operation speed by terminating a burst operation after actually read or written data is inputted or outputted, and a semiconductor memory device using the same.

In an embodiment, a burst termination control circuit includes a pull-up unit for pulling up a first node in response to a burst termination signal, a latch unit for latching a signal of the first node, a buffer for generating a first termination control signal for stopping data output operation by buffering an output signal of the latch unit, and a logic unit for generating a second termination control signal for stopping burst operation and generation of an output enable signal in response to an output signal of the latch unit.

In another embodiment, a semiconductor memory device includes a burst termination control unit for generating first and second termination control signals in response to a burst termination signal, a data output control unit for stopping a data output operation in response to the first termination control signal, a burst length control unit for stopping a burst operation according to a set burst length in response to the second termination control signal, and a column access control unit for generating an enable signal for performing column access operation, wherein the enable signal is disabled in response to the second termination control signal.

In another embodiment, a semiconductor memory device includes a burst termination control unit for generating a termination control signal in response to a burst termination signal, a data output control unit for stopping a data output operation in response to the termination control signal, a burst length control unit for stopping a burst operation according to a set burst length in response to the termination control signal, and a column access control unit for generating an enable signal for performing column access operation, wherein the enable signal is disabled in response to the termination control signal.

BRIEF DESCRIPTION OF THE DRAWINGS

The above and other aspects, features and other advantages will be more clearly understood from the following detailed description taken in conjunction with the accompanying drawings, in which.

DETAILED DESCRIPTION OF THE PREFERRED EMBODIMENTS

Hereinafter, an embodiment of the present invention will be described with reference to accompanying drawings. The embodiment is for illustrative purposes only, and the scope of the present invention is not limited thereto.

Figure 1:
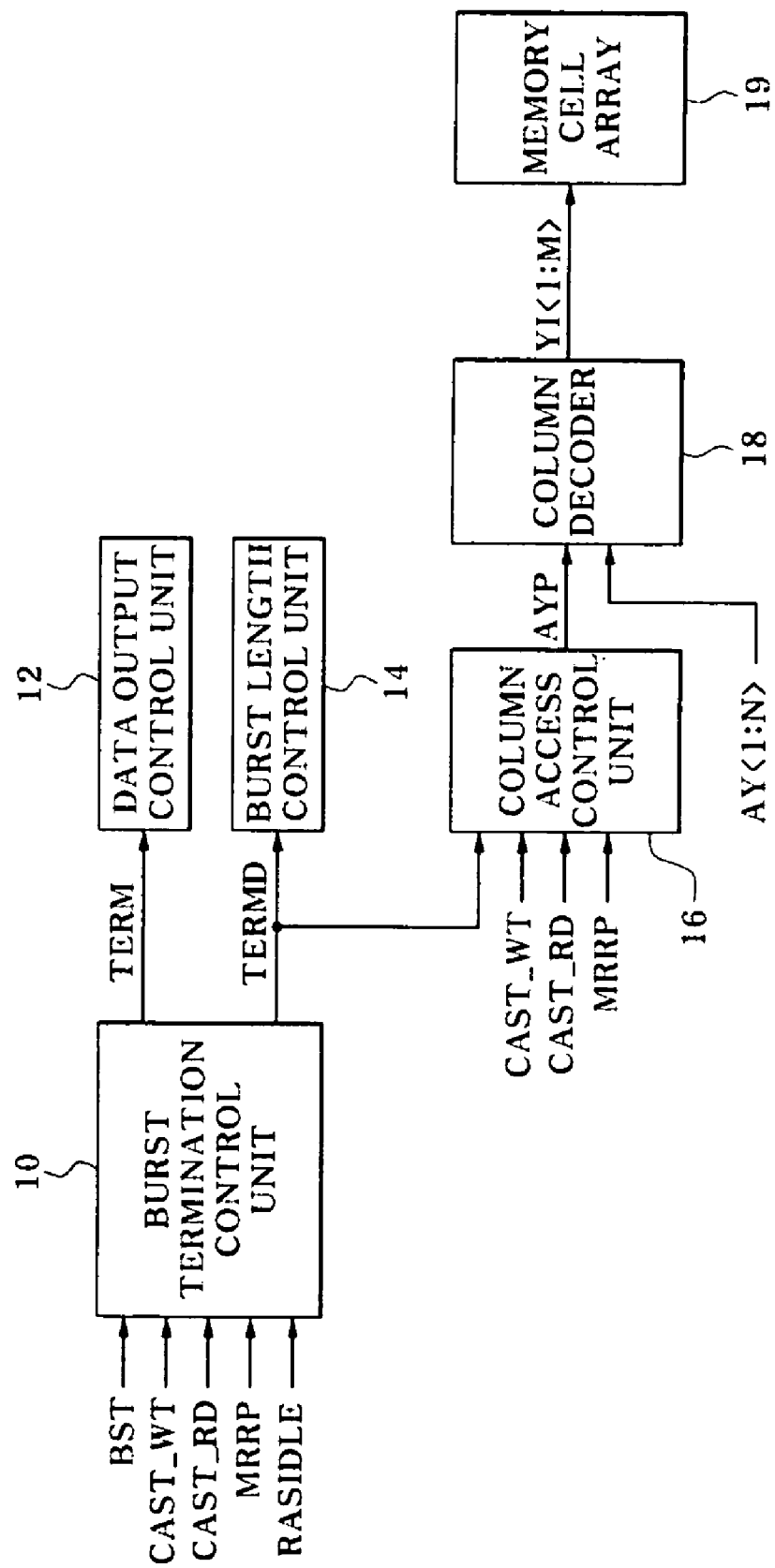
FIG. 1 is a block diagram illustrating a configuration of a semiconductor memory device in accordance with an embodiment of the present invention.
Figure 2:
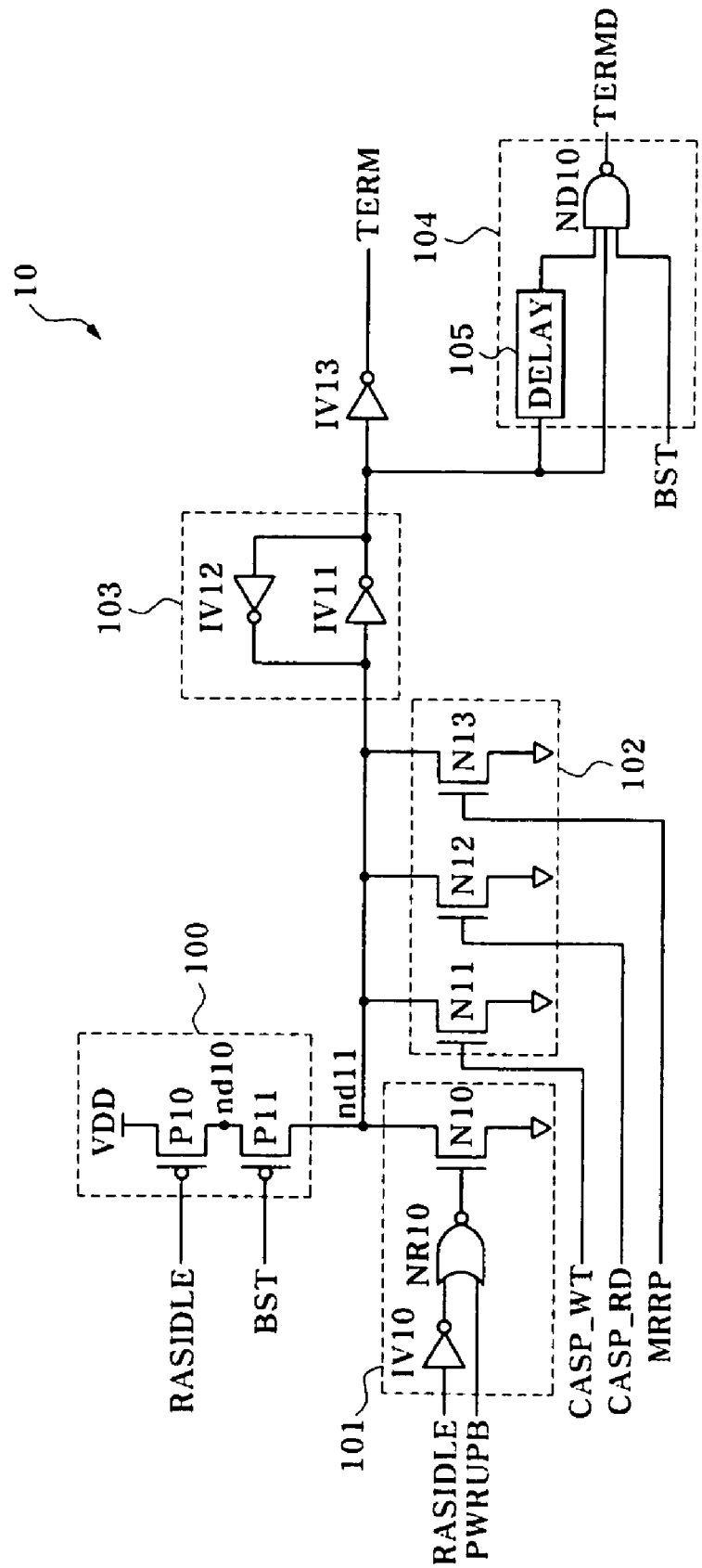
FIG. 2 is a circuit diagram illustrating a burst termination control unit included in the semiconductor memory device of FIG. 1.

FIG. 1 is a block diagram illustrating a configuration of a semiconductor memory device in accordance with an embodiment of the present invention, and FIG. 2 is a circuit diagram illustrating a burst termination control unit included in the semiconductor memory device of FIG. 1.

The semiconductor memory device of FIG. 1 includes a burst termination control unit 10, a data output control unit 12, a burst length control unit 14, a column access control unit 16, a column decoder 18 and a memory cell array 19. The burst termination control unit 10 will be described later.

The data output control unit 12 can be realized using, as a starting point, a known circuit for data output, for example, a data output buffer (not shown). But, the data output control unit 12 has a structural feature of stopping a data output operation when a first termination signal TERM of a high level is inputted.

The burst length control unit 14 can be realized using, as a starting point, known circuits for performing a burst operation according to a burst length set by a MRS. But, the burst length control unit 14 has a structural feature of stopping the burst operation when a second termination signal TERMD of a high level is inputted, and this structural feature can be easily realized by a person skilled in the art.

The column access control unit 16 receives a write signal CAST_WT applied as a pulse when a write command for write operation is inputted, a read signal CAST_RD applied as a pulse when a read command for read operation is inputted, and a mode resister read signal MRRP applied as a pulse when a mode resister read command for mode resister read operation is inputted. Also, the column access control unit 16 generates an enable signal AYP which is disabled to a low level when the second termination signal TERMD of a high level is inputted. That is to say, the enable signal is enabled to a high level when one of write operation, read operation and mode resister read operation is initiated, and is disabled to a low level when the second termination signal TERMD of a high level is inputted.

The column decoder 18 is driven when the enable signal AYP lo of a high level is inputted and decodes a plurality of column addresses AY<1:N> to generate a plurality of output enable signals YI<1:N> which control data input and output of the memory cell array 19. More specifically, the output enable signals YI<1:N> are control signals for selectively turning on a plurality of switches connected between the memory cell array 19 and the local input/output line (not shown).

Referring to FIG. 2, the burst termination control unit 10 includes a pull-up unit 100, an initialization unit 101, a pull-down unit 102, a latch unit 103, an inverter IV13 and a logic unit 104.

The pull-up unit 100 includes a PMOS transistor P10 connected between an external voltage VDD and a node nd10 and operating as a switch device turned on in response to a RAS idle signal RASIDLE, and a PMOS transistor P11 connected between the node nd10 and a node nd11 and operating as a switch device turned on in response to a burst termination signal BST. Here, the RAS idle signal RASIDLE is enabled to a high level in an idle state, i.e., in a state that there is no actual operation of the semiconductor memory device, and the burst termination signal BST is applied from outside or generated internally after the burst operation to actually read or written data is terminated.

The initialization unit 101 pulls down the node nd11 in a power up period in the idle state in response to the RAS idle signal and a power up signal PWRUPB. The power up signal PWRUPB is a signal which is at a low level in the power up period and is shifted to a high level after the power up period is ended.

The pull-down unit 102 includes NMOS transistors N11-N13 connected between the node nd11 and a ground voltage VSS and pulls down the node nd11 in response to any one or more of the write signal CAST_WT, the read signal CAST_RD and the mode resister read signal MRRP.

The latch unit 103 latches the signal of the node nd11 and the inverter IV13 inverts the output signal of the latch unit 103 to generate the first termination signal TERM. The logic unit 104 includes a delay unit 105 which delays the output signal of the latch unit 103 by a predetermined period and a NAND gate ND10 which operates a NAND operation on the output signal of the latch unit 103, an output signal of the delay unit 105 and the burst termination signal BST inputted thereto. The logic unit 104 generates the second termination signal TERMD which is disabled to a low level after lapse of the delay period of the delay unit 105 when the first termination signal TERM is disabled to a low level.

Figure 3:
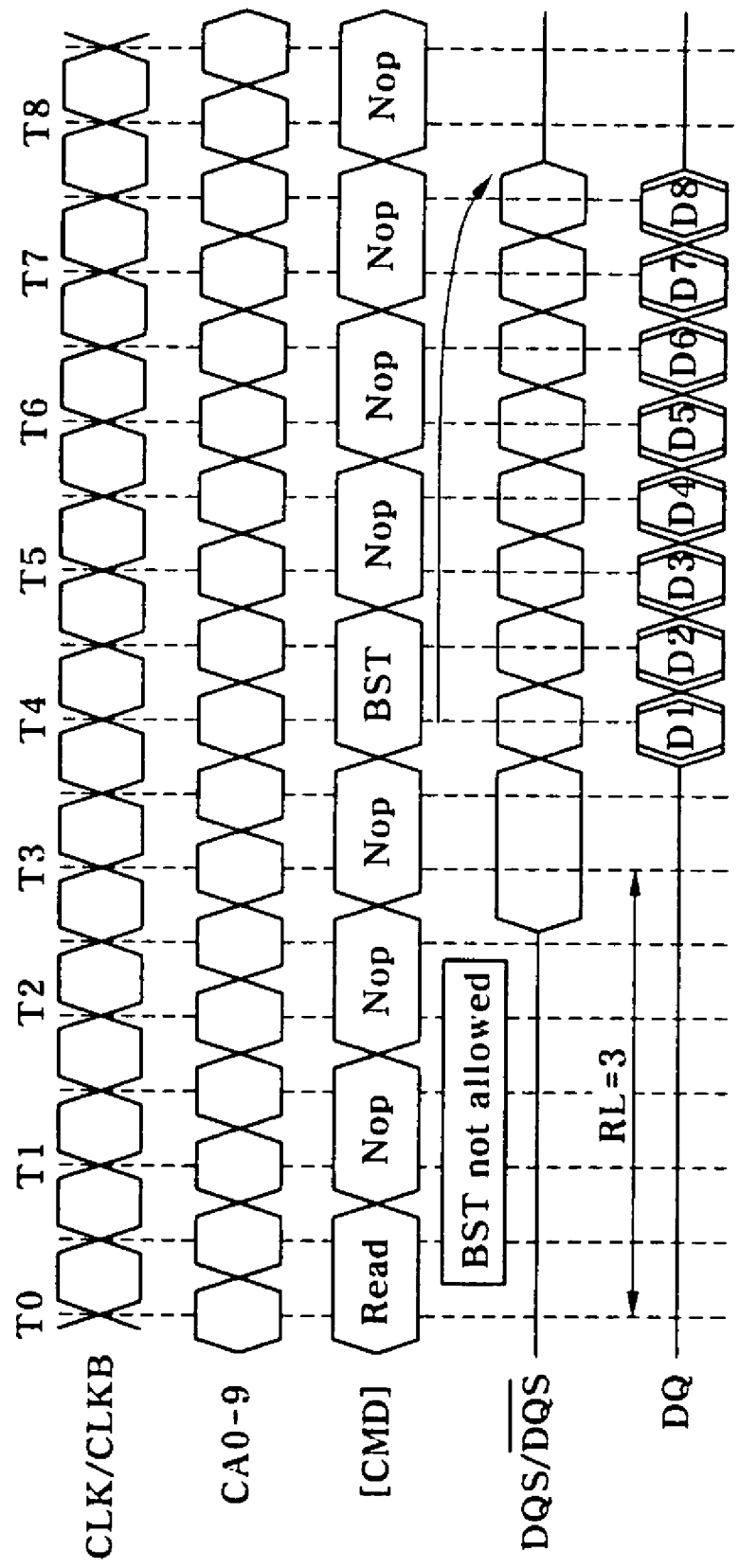
FIG. 3 is a timing diagram illustrating operation of the semiconductor memory device of FIG. 1.

An operation of the semiconductor memory device with aforementioned configuration will be described with reference to FIGS. 1 to 3. In the present embodiment, the actually read or written data is 8 bits in a state that the burst length is set to 16.

First, when any of the write signal CAST_WT, the read signal CAST_RD and the mode resist read signal MRRP is inputted with a high level, the node nd11 is pulled down to a low level to generate the first termination signal TERM and the second termination signal TERMD to a low level. Therefore, operations of the data output control unit 12 and the burst length control unit 14 are initiated, and the column decoder 18 decodes the plurality of column addresses AY<1:N> in response to the enable signal AYP of a high level generated in the column access control unit 16, to generate the plurality of output enable signals YI<1:M> which control the input/output of the memory cell array 19.

Next, when the burst operation on the actually read or written data of 8 bits is terminated, the burst termination signal BST is applied with a low level. By the burst termination signal BST of a low level and the idle signal RASIDLE in a low level during the burst operation, the node nd11 is pulled up to a high level and the first termination signal TERM and the second termination signal TERMD are shifted to a high level. The data output control unit 12 stops the data output operation in response to the first termination signal TERM generated to a high level, and the burst length control unit 14 stops the burst operation in response to the second termination signal TERMD generated to a high level. Also, the column access control unit 16 generates the enable signal AYP disabled to a low level in response to the second termination signal TERMD of a high level to stop the decoding operation of the column decoder 18. Referring to FIG. 3, it can be appreciated that, after the data of 8 bits is outputted by the read command, the burst termination signal BST is inputted and the burst operation is terminated.

Next, when one of the write signal CAST_WT, a read signal CAST_RD and the mode resist read signal MRRP is inputted with a high level, the node nd11 is pulled down to a low level to shift the first termination signal TERM and the second termination signal TERMD to a low level. Therefore, the operations of the data output control unit 12 and the burst length control unit 14 are initiated, and the column access control unit 16 generates the enable signal AYP of a high level. At this time, a period in which the second termination signal TERMD is shifted to a low level is delayed by the delay period of the delay unit 105 as compared to a period in which the first termination signal TERM is shifted to a low level. As such, the reason of delaying the period in which the second termination signal TERMD is shifted to a low level is for ensuring a margin for performing the burst operation.

As should be apparent from the above description, the semiconductor memory device in accordance with the present embodiment enhances operation speed by terminating the burst operation even before the burst operation according to the burst length set by the MRS is terminated when the burst operation on the actually read or written data is terminated.

Figure 4:
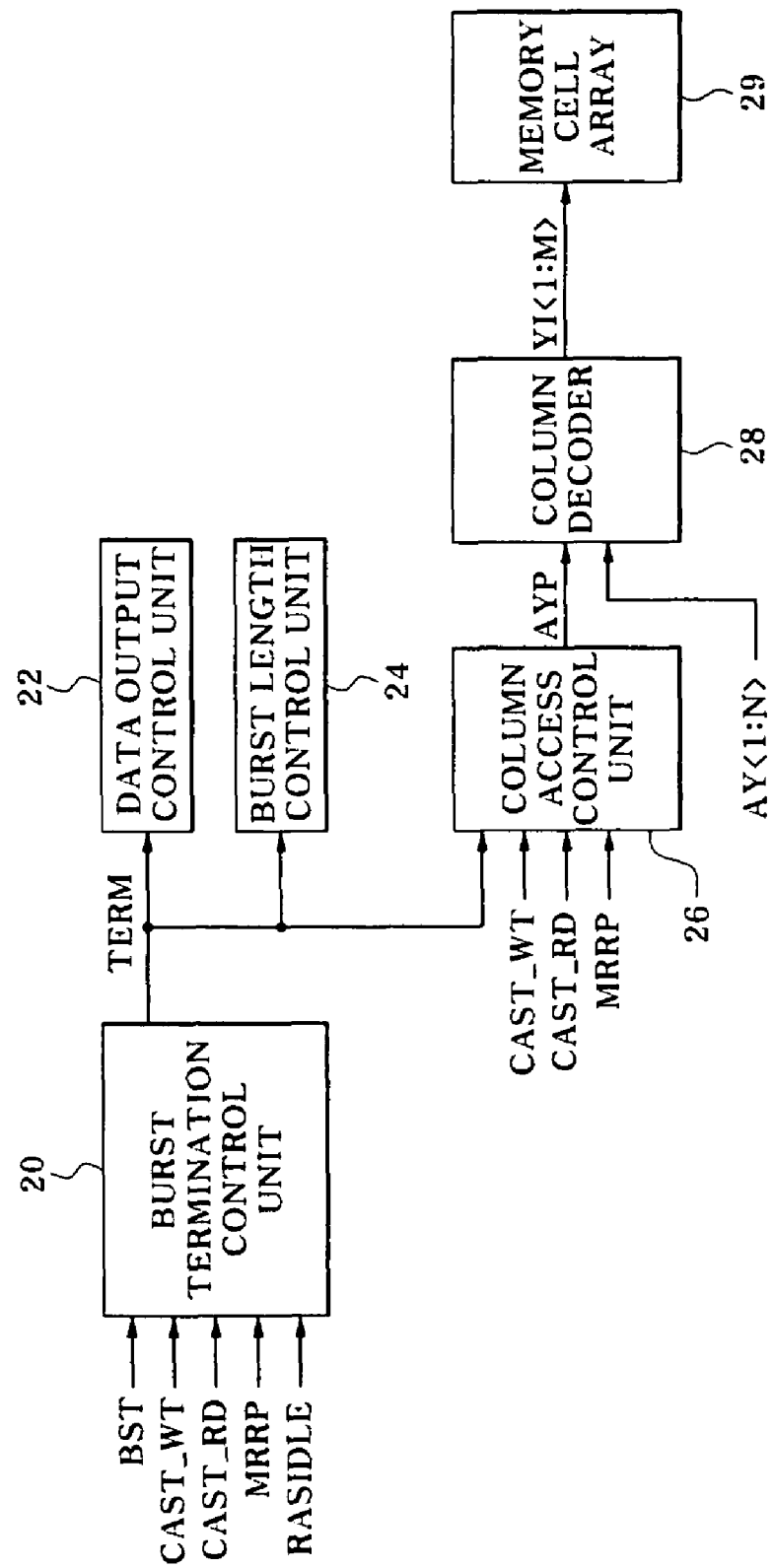
FIG. 4 is a block diagram illustrating a configuration of a semiconductor memory device in accordance with another embodiment of the present invention.
Figure 5:
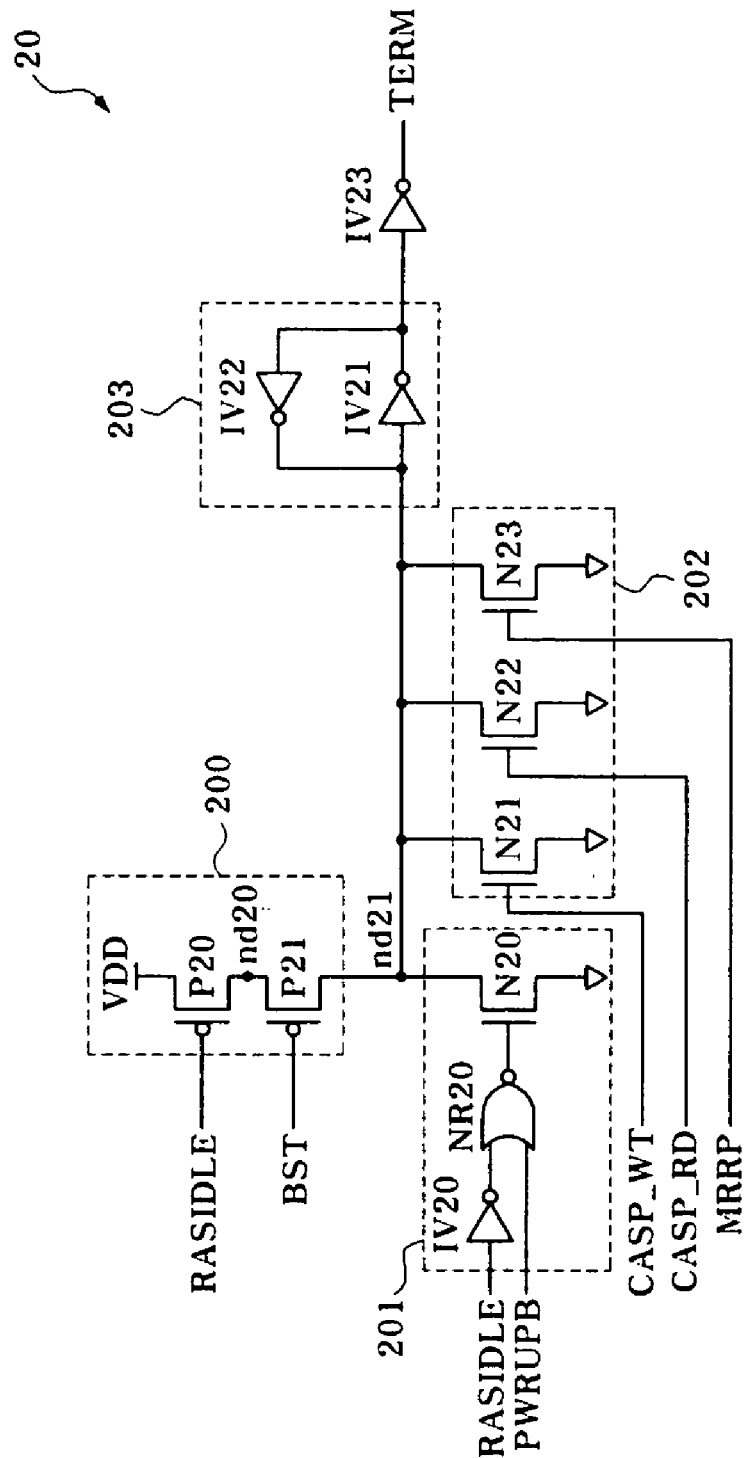
FIG. 5 is a circuit diagram illustrating a burst termination unit included in the semiconductor memory device of FIG. 4.

FIG. 4 is a block diagram illustrating a configuration of a semiconductor memory device in accordance with another embodiment of the present invention, and FIG. 5 is a circuit diagram lo illustrating a burst termination unit included in the semiconductor memory device shown in FIG. 4.

The semiconductor memory device of FIG. 4 includes a burst termination control unit 20, a data output control unit 22, a burst length control unit 24, a column access control unit 26, a column decoder 28 and a memory cell array 29. The burst termination control unit 20 will be described later.

The data output control unit 22 can be realized using, as a starting point, a known circuit for data output, for example, a data output buffer (not shown). But, the data output control unit 22 has a structural feature of stopping a data output operation when a termination signal TERM of a high level is inputted.

The burst length control unit 24 can be realized using, as a starting point, known circuits for performing a burst operation according to a burst length set by a MRS. But, the burst length control unit 24 has a structural feature of stopping the burst operation when the termination signal TERM of a high level is inputted, and this structural feature can be easily realized by a person skilled in the art.

The column access control unit 26 receives a write signal CAST_WT applied as a pulse when a write command for write operation is inputted, a read signal CAST_RD applied as a pulse when a read command for read operation is inputted, and a mode resister read signal MRRP applied as a pulse when a mode resister read command for mode resister read operation is inputted. Also, the column access control unit 26 generates an enable signal AYP which is disabled to a low level when the termination signal TERM of a high level is inputted. That is to say, the enable signal is enabled to a high level when one of the write operation, the read operation and the mode resister read operation is initiated, and is disabled to a low level when the termination signal TERM of a high level is inputted.

The column decoder 28 is driven when the enable signal AYP of a high level is inputted and decodes a plurality of column addresses AY<1:N> to generate a plurality of output enable signals YI<1:N> which control data input and output of the memory cell array 29. More specifically, the output enable signals YI<1:N> are control signals for selectively turning on a plurality of switches connected between the memory cell array 29 and the local input/output line (not shown).

Referring to FIG. 5, the burst termination control unit 20 includes a pull-up unit 200, an initialization unit 201, a pull-down unit 202, a latch unit 203 and an inverter IV23.

The pull-up unit 200 includes a PMOS transistor P20 connected between an external voltage VDD and a node nd20 and operating as a switch device turned on in response to a RAS idle signal RASIDLE, and a PMOS transistor P21 connected between the node nd20 and a node nd21 and operating as a switch device turned on in response to a burst termination signal BST.

The initialization unit 201 pulls down the node nd21 in a power up period in the idle state in response to the RAS idle signal and a power up signal PWRUPB.

The pull-down unit 202 includes NMOS transistors N21-N23 connected between the node nd21 and a ground voltage VSS and is pulls down the node nd11 in response to any one or more of the write signal CAST_WT, the read signal CAST_RD and the mode resister read signal MRRP.

The latch unit 203 latches the signal of the node nd21, and the inverter IV23 inverts the output signal of the latch unit 203 to generate the termination signal TERM.

An operation of the semiconductor memory device with the aforementioned configuration will be described with reference to FIGS. 4 and 5. In the present embodiment, the actually read or written data is 8 bits in a state that the burst length is set to 16.

First, when one of the write signal CAST_WT, a read signal CAST_RD and the mode resist read signal MRRP is inputted with a high level, the node nd21 is pulled down to a low level to generate the termination signal TERM to a low level. Therefore, operations of the data output control unit 22 and the burst length control unit 24 are initiated, and the column decoder 28 decodes the plurality of column addresses AY<1:N> in response to the enable signal AYP of a high level generated in the column access control unit 26, to generate the plurality of output enable signals YI<1:M> which control the input/output of the memory cell array 29.

Next, when the burst operation on the actually read or written data of 8 bits is terminated, the burst termination signal BST is applied with a low level. By the burst termination signal BST of a low level and an idle signal IDLE which is in a low level during the burst operation, the node nd21 is pulled up to a high level and the termination signal TERM is shifted to a high level.

Next, the data output control unit 22 stops the data output operation in response to the termination signal TERM of a high level, and the burst length control unit 24 stops the burst operation in response to the termination signal TERM of a high level. Also, the column access control unit 26 generates the enable signal AYP disabled to a low level in response to the termination signal TERM of a high level to stop the decoding operation of the column decoder 28.

Next, when one of the write signal CAST_WT, a read signal CAST_RD and the mode resist read signal MRRP is inputted with a high level, the node nd21 is pulled down to a low level to shift the termination signal TERM to a low level. Therefore, operations of the data output control unit 22 and the burst length control unit 24 are initiated, and the column access control unit 26 generates the enable signal AYP of a high level.

As should be apparent from the above description, the semiconductor memory device in accordance with the present embodiment enhances operation speed by terminating the burst operation even before the burst operation according to the burst length set by the MRS is terminated when the burst operation on the actually read or written data is terminated.

While the present invention has been described with respect to the particular embodiments, it will be apparent to those skilled in the art that various changes and modifications may be made without departing from the spirit and scope of the invention as defined in the following claims.

The present application claims priority to Korean application number 10-2008-01235454, filed on Dec. 5, 2008, which is incorporated by reference in its entirety.

What is claimed is:

1. A burst termination control circuit, comprising:
   a pull-up unit for pulling up a first node in response to a burst termination signal and a RAS idle sinal enabled in an idle state;
   a latch unit for latching a signal of the first node;
   a buffer for generating a first termination control signal for stopping data output operation by buffering an output signal of the latch unit; and
   a logic unit for generating a second termination control signal for stopping burst operation and generation of an output enable signal in response to the output signal of the latch unit.

2. The burst termination control circuit of claim 1, wherein the pull-up unit includes:
   a first switch device connected between an external voltage and a second node and turned on in response to the RAS idle signal enabled in the idle state; and
   a second switch device connected between the second node and the first node and turned on in response to the burst termination signal.

3. The burst termination control circuit of claim 1, wherein the logic unit generates the second termination control signal which is disabled after lapse of a predetermined period from a time point at which the burst termination signal is disabled.

4. The burst termination control circuit of claim 1, wherein the logic unit includes:
   a delay unit for delaying the output signal of the latch unit; and a logic device for performing a logic operation on the output signal of the latch unit, an output signal of the delay unit and the burst termination signal inputted thereto.

5. The burst termination control circuit of claim 1, further comprising:
   an initialization unit for initializing the first node in a power up period; and
   a pull-down unit for pulling down the first node in response to any one or more of a read command, a write command and a mode register read command.

6. A semiconductor memory device, comprising:
   a burst termination control unit for generating first and second termination control signals in response to a burst termination signal, a read command, a write command and a mode register read command;
   a data output control unit for stopping a data output operation in response to the first termination control signal;
   a burst length control unit for stopping a burst operation according to a set burst length, in response to the second termination control signal; and
   a column access control unit for generating an enable signal for performing column access operation, wherein the enable signal is disabled in response to the second termination control signal.

7. The semiconductor memory device of claim 6, wherein the burst termination control unit includes: a pull-up unit for pulling up a first node in response to the burst termination signal; a latch unit for latching a signal of the first node; a buffer for generating the first termination control signal by buffering an output signal of the latch unit; and a logic unit for generating the second termination control signal in response to the output signal of the latch unit.

8. The semiconductor memory device of claim 7, wherein the pull-up unit includes:
   a first switch device connected between an external voltage and a second node and turned on in response to a RAS idle signal enabled in an idle state; and
   a second switch device connected between the second node and the first node and turned on in response to the burst termination signal.

9. The semiconductor memory device of claim 7, wherein the logic unit generates the second termination control signal which is disabled after lapse of a predetermined period from a time point at which the burst termination signal is disabled.

10. The semiconductor memory device of claim 7, wherein the logic unit includes:
    a delay unit for delaying the output signal of the latch unit; and
    a logic device for performing a logic operation on the output signal of the latch unit, an output signal of the delay unit and the burst termination signal inputted thereto.

11. The semiconductor memory device of claim 7, wherein the burst termination control unit further includes:

an initialization unit for initializing the first node in a power up period; and
a pull-down unit for pulling down the first node in response to any one or more of the read command, the write command and the mode register read command.

12. The semiconductor memory device of claim 6, further comprising:
    a column decoder for generating an output enable signal for controlling data input/output of the memory cell array, by performing decoding operation in response to the enable signal.

13. A semiconductor memory device, comprising:
    a burst termination control unit for generating a termination control signal in response to a burst termination signal, a read command, a write command and a mode register read command;
    a data output control unit for stopping a data output operation in response to the termination control signal;
    a burst length control unit for stopping a burst operation according to a set burst length, in response to the termination control signal; and
    a column access control unit for generating an enable signal for performing column access operation, wherein the enable signal is disabled in response to the termination control signal.

14. The semiconductor memory device of claim 13, wherein the burst termination control unit includes:
    a pull-up unit for pulling up a first node in response to the burst termination signal;
    a latch unit for latching a signal of the first node; and
    a buffer for generating the termination control signal by buffering an output signal of the latch unit.

15. The semiconductor memory device of claim 14, wherein the pull-up unit includes:
    a first switch device connected between an external voltage and a second node and turned on in response to a RAS idle signal enabled in an idle state; and
    a second switch device connected between the second node and the first node and turned on in response to the burst termination signal.

16. The semiconductor memory device of claim 14, wherein the burst termination control unit further includes:
    an initialization unit for initializing the first node in a power up period; and
    a pull-down unit for pulling down the first node in response to any one or more of the read command, the write command and the mode register read command.

17. The semiconductor memory device of claim 13, further comprising:
    a column decoder for generating an output enable signal for controlling data input/output of the memory cell array, by performing decoding operation in response to the enable signal.

* * * * *